(12) United States Patent
Takano et al.

(10) Patent No.: US 7,441,330 B2
(45) Date of Patent: Oct. 28, 2008

(54) PROCESS FOR PRODUCING CIRCUIT BOARD

(75) Inventors: Kenji Takano, Kawasaki (JP); Munekazu Shibata, Kawasaki (JP); Kazuya Arai, Kawasaki (JP); Junichi Kanai, Kawasaki (JP); Kaoru Sugimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 79 days.

(21) Appl. No.: 11/581,589

(22) Filed: Oct. 17, 2006

(65) Prior Publication Data

US 2007/0289128 A1    Dec. 20, 2007

(30) Foreign Application Priority Data

Jun. 16, 2006    (JP)    .............................. 2006-166980

(51) Int. Cl.
*H05K 3/02* (2006.01)
(52) U.S. Cl. .............................. 29/846; 29/825; 29/830; 29/852
(58) Field of Classification Search .................. 29/825, 29/830, 846, 852
See application file for complete search history.

(56) References Cited

U.S. PATENT DOCUMENTS

| 6,429,942 B1 * | 8/2002 | Soares ........................ 356/614 |
| 6,869,750 B2 * | 3/2005 | Zhang et al. ................. 430/312 |
| 2004/0211751 A1 * | 10/2004 | Shuto et al. .................... 216/13 |

FOREIGN PATENT DOCUMENTS

JP    2004-235323    8/2004

* cited by examiner

*Primary Examiner*—C. J Arbes
(74) *Attorney, Agent, or Firm*—Kratz, Quintos & Hanson, LLP

(57) ABSTRACT

A process for producing a circuit board includes the steps of etching the third metal layer of a three-layer metal laminate into a predetermined interconnection pattern by photolithography; forming a laminate on the interconnection pattern by a buildup method, the laminate including interconnection patterns with insulating layers provided therebetween, the interconnection patterns being electrically connected to each other; separating a first metal layer from a supporting substrate to detach the laminate; removing the first metal layer of the three-layer metal laminate by etching using a second metal layer as a barrier layer; and removing the exposed second metal layer by etching.

6 Claims, 6 Drawing Sheets

PROCESS FOR PRODUCING CIRCUIT BOARD

BACKGROUND OF THE INVENTION

1. Field of the Invention

The present invention relates to a process for producing a circuit board. In particular, the present invention relates to a process for efficiently producing a thin circuit board with high-density interconnections.

2. Description of the Related Art

FIG. 11A to 12F are each a process drawing of an example of a known circuit board (see Japanese Unexamined Patent Application Publication No. 2004-235323).

In FIG. 11A, a supporting substrate 10 includes a copper-clad laminate in which copper foil 11 is bonded on the front surface and the back surface of a resin plate 10a.

Dummy metal layers 41 are bonded to both surfaces of the supporting substrate 10 with adhesive layers 40. Two-layer metal laminates 43, which are larger than the dummy metal layers 41, are bonded to the surfaces of the supporting substrate 10 at peripheries of the dummy metal layers 41 with the adhesive layers 40 so as to cover the dummy metal layers 41 (see FIG. 11B). The two-layer metal laminates 43 each include a copper layer 42; and a metal layer 42a composed of nickel, titanium, or chromium, which is not etched with an etching solution for copper, the metal layer 42a being disposed on the copper layer 42.

As shown in FIG. 11C, a laminate 50 in which interconnection patterns 44 are laminated with insulating layers 46 provided therebetween and are electrically connected to each other using vias 48 is formed on each two-layer metal laminate 43 by a buildup method.

As shown in FIG. 11D, the laminates 50 and the supporting substrate 10 are cut at inner positions compared with the periphery of each dummy metal layer 41 to separate each dummy metal layer 41 from the corresponding two-layer metal laminate 43 to detach the laminates 50.

As shown in FIG. 12A, the copper layer 42 of each two-layer metal laminates 43 is removed by etching using the metal layer 42a as a barrier layer.

As shown in FIG. 12B, the metal layer 42a is removed by etching.

The laminate 50 is inverted (see FIG. 12C). Patterns 52 each composed of a solder resist are formed on the front surface and the back surface of the laminate 50 (FIG. 12D). The exposed interconnection pattern 44 is plated with nickel and then gold using the pattern 52 as a mask to form protective plating layers 54 (FIG. 12E). Solder bumps 56 are formed on predetermined positions to complete the circuit board (FIG. 12F).

In the known method for producing a circuit board as shown in FIG. 11C, all of the interconnection patterns 44 in the laminates 50 are formed on the metal layers 42a by a buildup method. In the buildup method, the copper layers are formed by plating, which requires a prolonged period of time, and etched by etching to form the patterns. Thus, such pattern formation disadvantageously requires a prolonged period of time. In particular, a larger number of laminated layers requires a more prolonged period of time.

SUMMARY OF THE INVENTION

Accordingly, the present invention was accomplished to overcome the problems described above. It is an object of the present invention to provide a process for efficiently producing a thin circuit board with high-density interconnections.

To achieve the object, the present invention provides the following process.

A process according to the present invention for producing a circuit board includes the steps of detachably stacking a three-layer metal laminate on a surface of a supporting substrate such that a first metal layer of the three-layer metal laminate is in contact with the surface of the supporting substrate, the three-layer metal laminate including the first metal layer, a second metal layer that is not etched by an etching solution for the first metal layer, and a third metal layer composed of the same metal material as that of the first metal layer laminated in that order; etching the third metal layer of the three-layer metal laminate by photolithography into a predetermined interconnection pattern; forming a laminate on the interconnection pattern by a buildup method, the laminate including interconnection patterns with insulating layers provided therebetween, the interconnection patterns being electrically connected to each other; separating the first metal layer from the supporting substrate to detach the laminate; removing the first metal layer of the three-layer metal laminate by etching using the second metal layer as a barrier layer; and removing the exposed second metal layer by etching.

The first metal layer of the three-layer metal laminate preferably has a greater thickness than the third metal layer.

The process according to the present invention for producing a circuit board described above further includes bonding a dummy metal layer to a surface of the supporting substrate with an adhesive layer; bonding the three-layer metal laminate to the surface of the supporting substrate at the periphery of the first metal layer with the adhesive layer so as to cover the dummy metal layer, the three-layer metal laminate being larger than the dummy metal layer; and cutting the laminate and the supporting substrate at inner positions compared with the periphery of the dummy metal layer and separating the first metal layer from the dummy metal layer to detach the laminate.

A process according to the present invention for producing a circuit board includes the steps of detachably stacking three-layer metal laminates on the front surface and the back surface of a supporting substrate such that a first metal layer of each of the three-layer metal laminate is in contact with the corresponding surface of the supporting substrate, the three-layer metal laminates each including the first metal layer, a second metal layer that is not etched by an etching solution for the first metal layer, and a third metal layer composed of the same metal material as that of the first metal layer laminated in that order; etching the third metal layers of the three-layer metal laminates by photolithography into predetermined interconnection patterns; forming laminates on the interconnection patterns by a buildup method, the laminate including interconnection patterns with insulating layers provided therebetween, the interconnection patterns being electrically connected to each other; separating the first metal layers from the supporting substrate to detach the laminates; removing the first metal layers of the three-layer metal laminates by etching using the second metal layers as barrier layers; and removing the exposed second metal layers by etching.

The first metal layer of each three-layer metal laminate preferably has a greater thickness than the third metal layer.

The process according to the present invention for producing a circuit board described above further includes the steps of bonding dummy metal layers to the front surface and the back surface of the supporting substrate with adhesive layers; bonding the three-layer metal laminates to the surfaces of the supporting substrate at peripheries of the first metal layers with the adhesive layers so as to cover the dummy metal layers, each of the three-layer metal laminates being larger than the corresponding dummy metal layer; and cutting the laminates and the supporting substrate at inner positions compared with the periphery of each dummy metal layer and separating each first metal layer from the corresponding dummy metal layer to detach the laminates.

In the present invention, the three-layer metal laminate is formed in advance separately from the production process of the circuit board. The third metal layer of the three-layer metal laminate is etched to form the uppermost interconnection pattern disposed at one side. The interconnection pattern is not formed by plating requiring a prolonged period of time in a buildup method, thus reducing a time requiring for the production of the circuit board and enhancing efficiency. Furthermore, the interconnection pattern functions as an embedded interconnection that is embedded in the insulating layer, the surface of the embedded interconnection being smooth and exposed. Thus, an LSI is mounted easily and surely. Moreover, the circuit board is formed on the supporting substrate and then detached from the supporting substrate, thereby efficiently producing a thin circuit board with high-density interconnections.

DESCRIPTION OF THE PREFERRED EMBODIMENTS

Preferred embodiments of the present invention will be described in detail with reference to the drawings.

FIGS. 1 to 10 are each an explanation view of a process according to the present invention for producing a circuit board.

Figure 1:
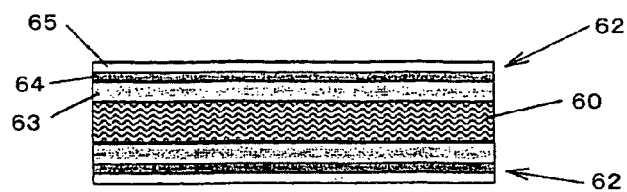
FIG. 1 is an explanation view of a state in which a three-layer metal laminate is formed on each surface of a supporting substrate.

As shown in FIG. 1, three-layer metal laminates 62 are detachably laminated on the front surface and the back surface of a supporting substrate 60.

Each three-layer metal laminate 62 includes a first metal layer 63, a second metal layer 64 that is not etched with an etching solution capable of etching the first metal layer 63, and a third metal layer 65 composed of the same material as that of the first metal layer 63 laminated in that order.

For example, each first metal layer 63 is formed of relatively thick copper foil having a thickness of about 70 µm. For example, each second metal layer 64 is formed of a nickel, chromium, or titanium layer having a thickness of about 1 µm. The second metal layers 64 are formed on the first metal layers 63 by electrolytic etching or sputtering. For example, each third metal layer 65 is formed of a copper layer having a thickness of about 18 µm. The third metal layers 65 are formed on the second metal layers 64 by electrolytic etching or the like.

The supporting substrate 60 is composed of a material having stiffness sufficient to achieve good handleability in forming an insulating layer or a plating layer and in transporting the supporting substrate 60 and having strength sufficient to prevent deformation, such as shrinkage and warpage. In this embodiment, the supporting substrate 60 is an epoxy resin substrate containing a glass cloth, the epoxy resin substrate having a thickness of 0.3 to 0.4 mm. The supporting substrate 60 may be formed of only a resin substrate such as the epoxy resin substrate containing a glass cloth or may be formed of only a metal plate, as long as a predetermined strength is ensured.

Figure 2:
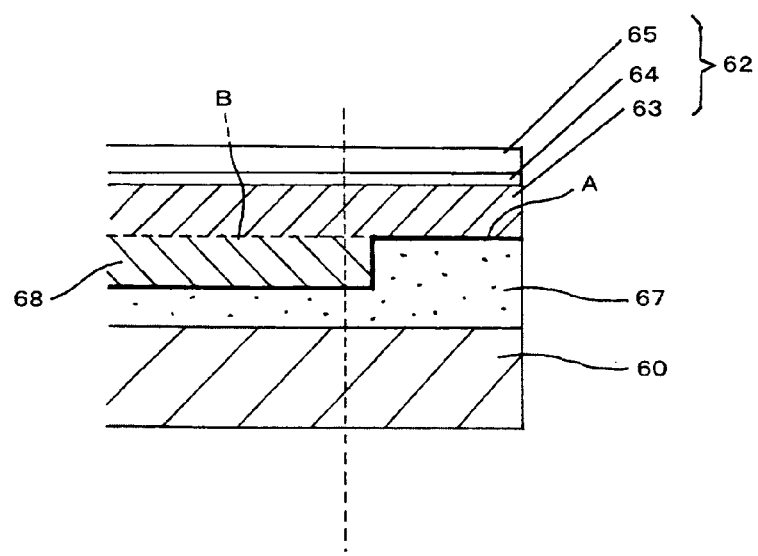
FIG. 2 is an explanation view of an example of a structure in which the three-layer metal laminate is detachably laminated on the supporting substrate.

To detachably laminate each three-layer metal laminate 62 on the supporting substrate 60, a structure shown in FIG. 2 is preferred.

That is, dummy metal layers 68 are bonded to the front surface and the back surface of the supporting substrate 60 with adhesive layers 67. The three-layer metal laminates 62 are bonded on the surfaces of the supporting substrate at peripheries of first metal layers 63 with the adhesive layers 67 to cover the dummy metal layers 68, each three-layer metal laminate 62 being larger than the corresponding dummy metal layer 68.

In FIG. 2, thick line A indicates a portion in which the dummy metal layer 68 is bonded to the adhesive layer 67 and the three-layer metal laminate 62 is bonded to the adhesive layer 67. Furthermore, dashed line B indicates a portion in which the three-layer metal laminate 62 is only in contact with the dummy metal layer 68. The three-layer metal laminate 62, the dummy metal layer 68, and the supporting substrate 60 are cut along ling C that is located at an inner position compared with the periphery of the dummy metal layer 68 to separate the dummy metal layer 68 from the first metal layer 63, thereby detaching the three-layer metal laminate 62. To prevent the inclusion of air at the portion indicated by dashed line B, these lamination steps are preferably performed in a vacuum apparatus.

Figure 3:
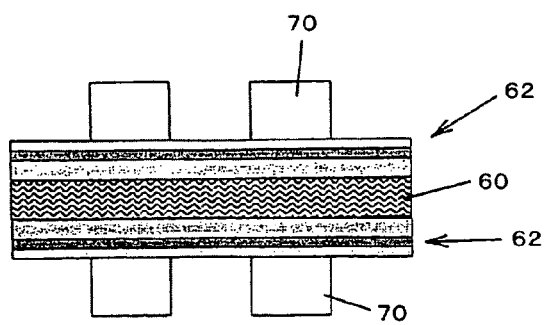
FIG. 3 is an explanation view of a state in which a resist pattern is formed on the surface of each three-layer metal laminate.
Figure 4:
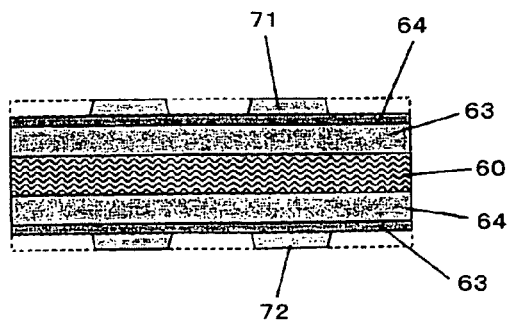
FIG. 4 is an explanation view of a state in which the third metal layer of each three-layer metal laminate is formed into an interconnection pattern by photolithography.

As shown in FIG. 3, predetermined resist patterns 70 are formed on the third metal layers 65. As shown in FIG. 4, a series of photolithographic steps are performed, i.e., exposure and development are performed using the resist patterns 70 as masks and then the resist patterns 70 are removed. In this way, the third metal layers 65 are etched by etching into predetermined interconnection patterns 71.

Figure 5:
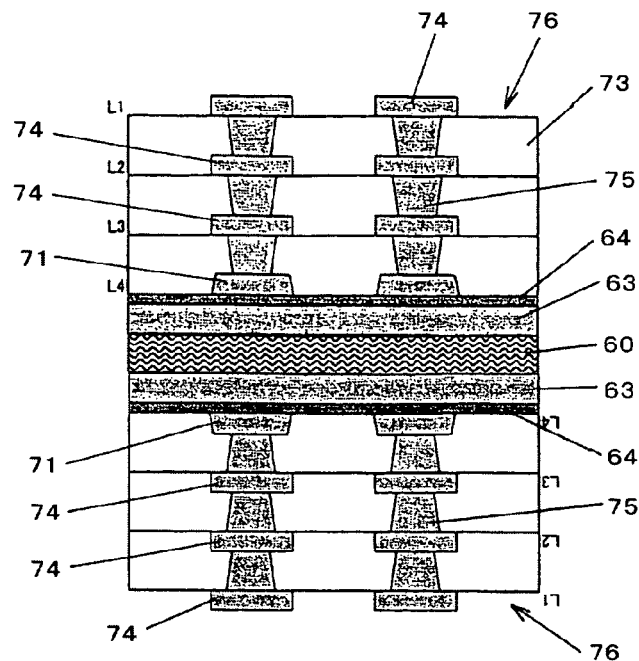
FIG. 5 is an explanation view of a state in which a multilayer interconnection pattern is formed by a buildup method on each initially formed interconnection pattern shown in FIG. 4.

As shown in FIG. 5, a laminate 76 in which interconnection patterns 74 are laminated with insulating layers 73 provided therebetween and are electrically connected to each other using vias 75 is formed on each interconnection pattern 71 by a buildup method.

Figure 6:
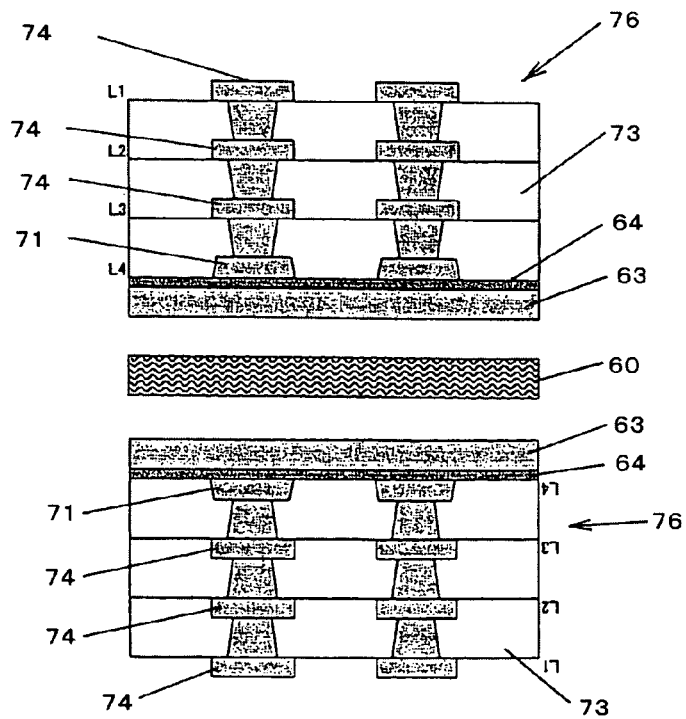
FIG. 6 is an explanation view of a state in which laminates formed in a step shown in FIG. 5 are detached from the supporting substrate.

The laminates are cut along line C shown in FIG. 2 to detach the laminates 76 from the supporting substrate 60 as shown in FIG. 6.

Figure 7:
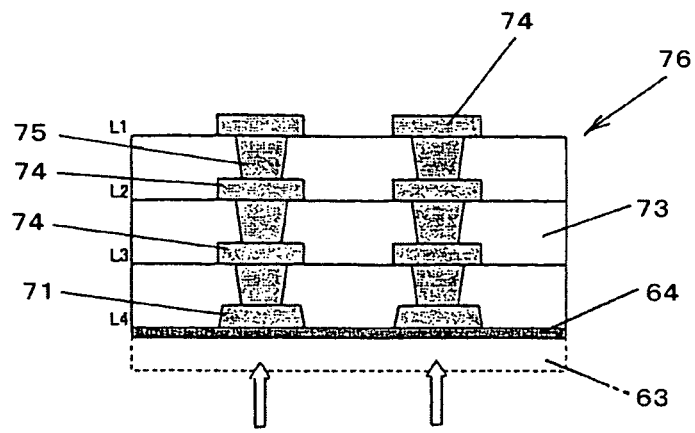
FIG. 7 is an explanation view of a state in which a first metal layer is removed from the laminate by etching.

The first metal layer 63 of each detached laminate 76 is removed by etching using the second metal layer 64 as a barrier layer as shown in FIG. 7.

Figure 8:
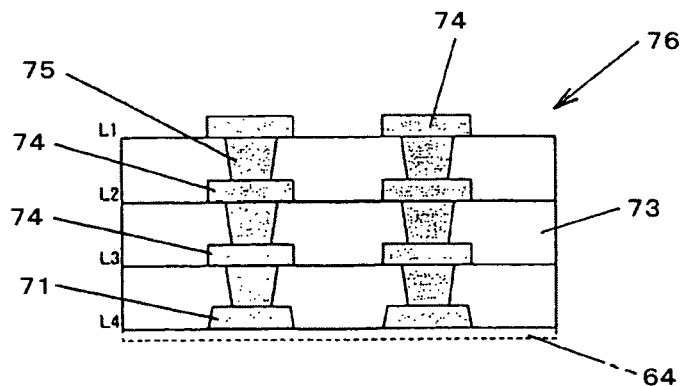
FIG. 8 is an explanation view of a state in which a second metal layer is further removed from the laminate by etching.

As shown in FIG. 8, the exposed second metal layer 64 is removed by etching. In this case, the interconnection pattern 71, which has been formed by etching the third metal layer 65, is not etched with an etching solution for the second metal layer 64. Thus, the interconnection pattern 71 serves as an embedded interconnection that is embedded in the insulating layer 73, the surface being exposed as shown in FIG. 8.

The embedded interconnection is not obtained by plating requiring a prolonged period of time in a buildup method but obtained by etching the third metal layer 65 of the three-layer metal laminate 62, thereby reducing a time required for producing a circuit board.

Figure 9:
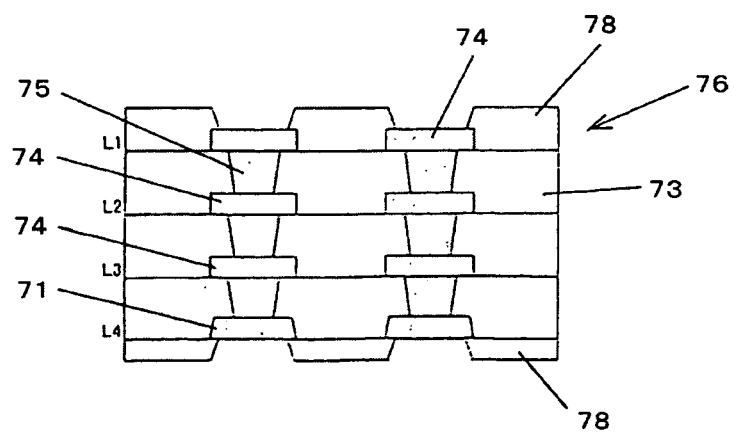
FIG. 9 is an explanation view of a state in which a solder resist pattern is formed on the laminate.
Figure 10:
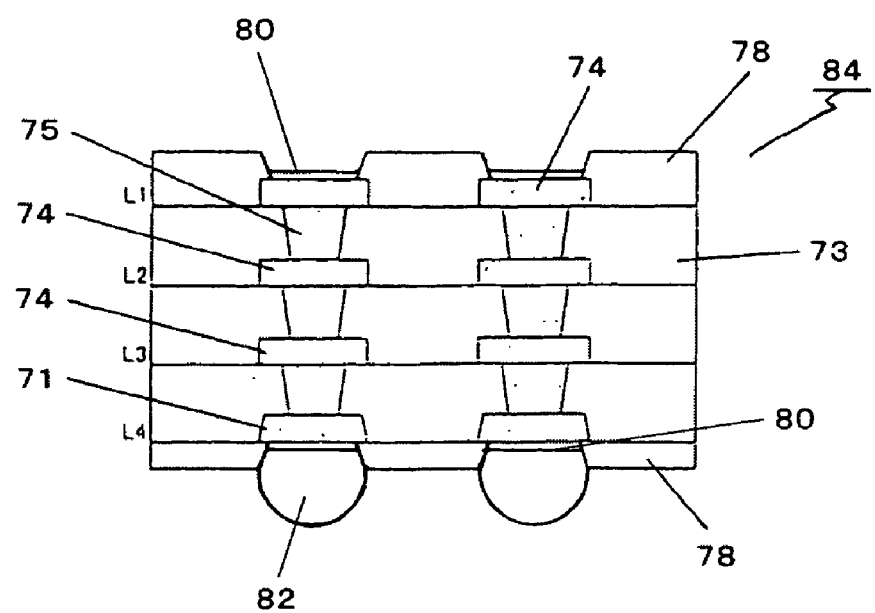
FIG. 10 is an explanation view of a state in which solder bumps are formed on the exposed interconnection pattern to complete a circuit board.
Figure 11A:
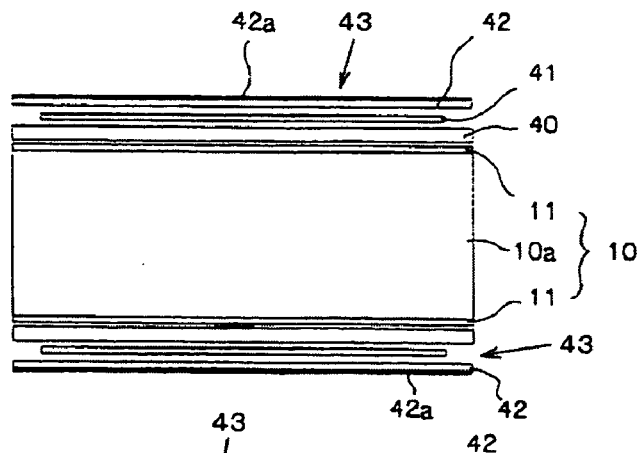
FIGS. 11A to 11D are each a process drawing showing former steps in a known method for producing a circuit board.
Figure 11B:
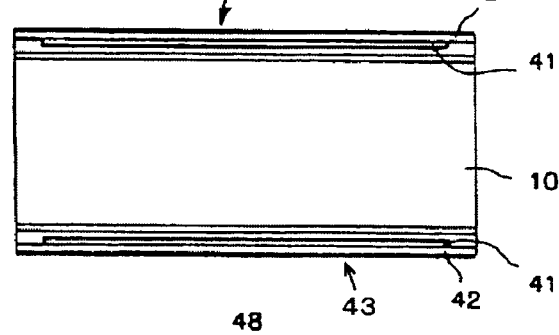
Figure 11C:
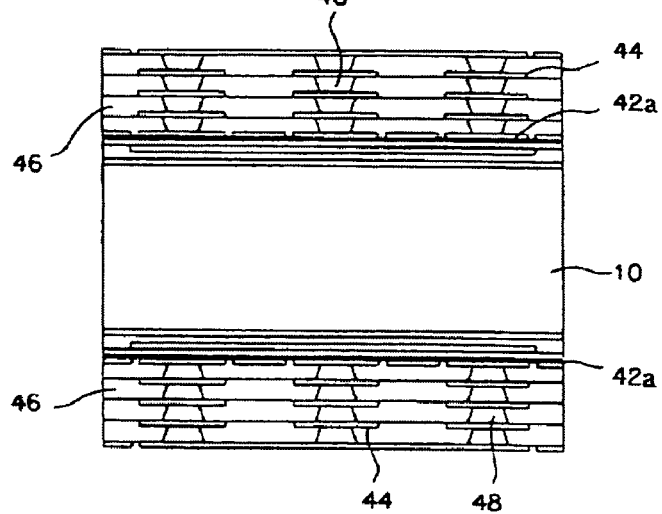
Figure 11D:
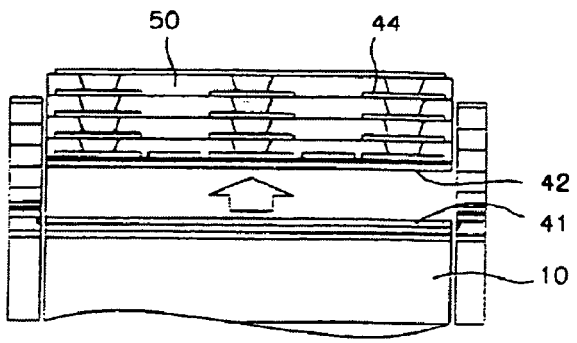
Figure 12A:
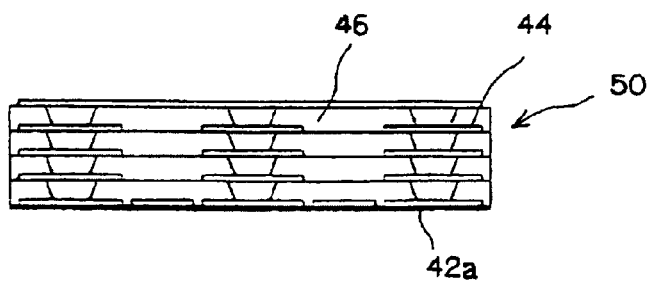
FIGS. 12A to 12F are each a process drawing showing later steps in the known method for producing a circuit board.
Figure 12B:
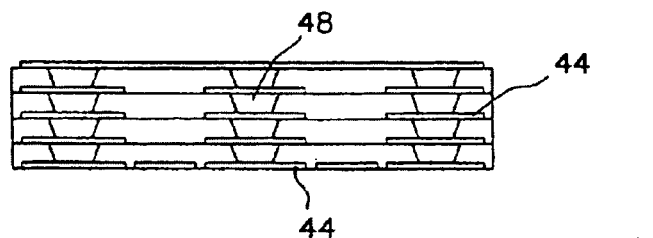
Figure 12C:
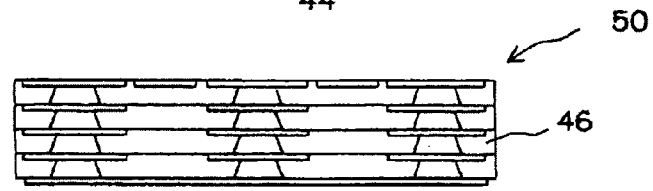
Figure 12D:
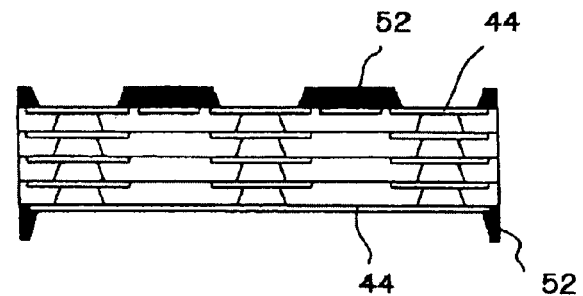
Figure 12E:
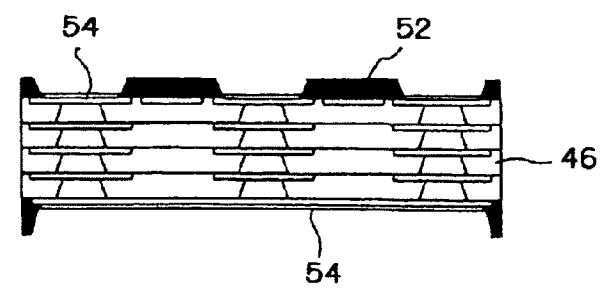
Figure 12F:
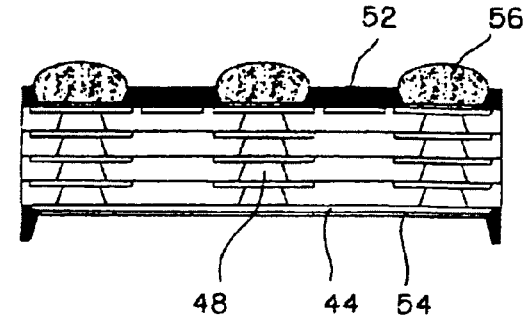

As shown in FIG. 9, solder resist layers 78 are formed on the front surface and the back surface of each laminate 76 such that predetermined portions of the interconnection pattern 71 disposed at the back surface of the laminate 76 and the interconnection pattern 74 disposed at the front surface of the laminate 76 are exposed. As shown in FIG. 10, the exposed portions of the interconnection patterns 71 and 74 are plated with nickel and then gold to form protective plating films 80. Furthermore, solder bumps 82 are formed on the protective plating films 80 on the interconnection pattern 71 to complete a circuit board 84.

With respect to the circuit board 84, generally, a plurality of circuit boards are formed in one piece and then separated into pieces, thereby making target circuit boards.

In the above-described embodiment, the laminates 76 are formed on the front surface and the back surface of the supporting substrate 60. However, the laminate 76 may be formed on only one surface of the supporting substrate 60.

What is claimed is:

1. A process for producing a circuit board, comprising the steps of:
   detachably stacking a three-layer metal laminate on a surface of a supporting substrate such that a first metal layer of the three-layer metal laminate is in contact with the surface of the supporting substrate, the three-layer metal laminate including the first metal layer, a second metal layer that is not etched by an etching solution for the first metal layer, and a third metal layer composed of the same metal material as that of the first metal layer laminated in that order;
   etching the third metal layer of the three-layer metal laminate by photolithography into a predetermined interconnection pattern;
   forming a laminate on the interconnection pattern by a buildup method, the laminate including interconnection patterns with insulating layers provided therebetween, the interconnection patterns being electrically connected to each other;
   separating the first metal layer from the supporting substrate to detach the laminate;
   removing the first metal layer of the three-layer metal laminate by etching using the second metal layer as a barrier layer; and
   removing the exposed second metal layer by etching.

2. The process for producing a circuit board according to claim 1, wherein the first metal layer of the three-layer metal laminate has a greater thickness than the third metal layer.

3. The process for producing a circuit board according to claim 1, further comprising the steps of:
   bonding a dummy metal layer to a surface of the supporting substrate with an adhesive layer;
   bonding the three-layer metal laminate to the surface of the supporting substrate at the periphery of the first metal layer with the adhesive layer so as to cover the dummy metal layer, the three-layer metal laminate being larger than the dummy metal layer; and
   cutting the laminate and the supporting substrate at inner positions compared with the periphery of the dummy metal layer and separating the first metal layer from the dummy metal layer to detach the laminate.

4. A process for producing a circuit board, comprising the steps of:
   detachably stacking three-layer metal laminates on the front surface and the back surface of a supporting substrate such that a first metal layer of each of the three-layer metal laminate is in contact with the corresponding surface of the supporting substrate, the three-layer metal laminates each including the first metal layer, a second metal layer that is not etched by an etching solution for the first metal layer, and a third metal layer composed of the same metal material as that of the first metal layer laminated in that order;
   etching the third metal layers of the three-layer metal laminates by photolithography into predetermined interconnection patterns;
   forming laminates on the interconnection patterns by a buildup method, the laminate including interconnection patterns with insulating layers provided therebetween, the interconnection patterns being electrically connected to each other;
   separating the first metal layers from the supporting substrate to detach the laminates;
   removing the first metal layers of the three-layer metal laminates by etching using the second metal layers as barrier layers; and
   removing the exposed second metal layers by etching.

5. The process for producing the circuit board according to claim 4, wherein the first metal layer of each three-layer metal laminate has a greater thickness than the third metal layer.

6. The process for producing a circuit board according to claim 4, further comprising the steps of:
   bonding dummy metal layers to the front surface and the back surface of the supporting substrate with adhesive layers;
   bonding the three-layer metal laminates to the surfaces of the supporting substrate at peripheries of the first metal layers with the adhesive layers so as to cover the dummy metal layers, each of the three-layer metal laminates being larger than the corresponding dummy metal layer; and
   cutting the laminates and the supporting substrate at inner positions compared with the periphery of each dummy metal layer and separating each first metal layer from the corresponding dummy metal layer to detach the laminates.

* * * * *